(12) United States Patent
Kim et al.

(10) Patent No.: US 11,460,502 B2
(45) Date of Patent: Oct. 4, 2022

(54) PROCESSOR-BASED MEASURING METHOD FOR TESTING DEVICE UNDER TEST, AND MEASURING DEVICE USING SAME

(71) Applicant: Byung Kyu Kim, Gyeonggi-do (KR)

(72) Inventors: Byung Kyu Kim, Seongnam-si (KR); Byeong Yun Kim, Seoul (KR)

(73) Assignee: PHOSPHIL INC., Seoul (KR)

(*) Notice: Subject to any disclaimer, the term of this patent is extended or adjusted under 35 U.S.C. 154(b) by 171 days.

(21) Appl. No.: 16/624,559

(22) PCT Filed: Jun. 7, 2018

(86) PCT No.: PCT/KR2018/006471
§ 371 (c)(1),
(2) Date: Dec. 19, 2019

(87) PCT Pub. No.: WO2018/236080
PCT Pub. Date: Dec. 27, 2018

(65) Prior Publication Data
US 2020/0393509 A1 Dec. 17, 2020

(30) Foreign Application Priority Data

Jun. 20, 2017 (KR) .......................... 10-2017-0077892

(51) Int. Cl.
*G01R 31/52* (2020.01)
*G01R 31/319* (2006.01)

(52) U.S. Cl.
CPC .......... *G01R 31/319* (2013.01); *G01R 31/52* (2020.01)

(58) Field of Classification Search
CPC .............................. G01R 31/319; G01R 31/52; G01R 31/50–71; G01R 31/3191–31928
See application file for complete search history.

(56) References Cited

U.S. PATENT DOCUMENTS 4,862,070 A * 8/1989 Ostertag ................. G01R 31/66
324/73.1
5,254,942 A * 10/1993 D'Souza .......... G01R 31/31858
324/73.1
(Continued)

FOREIGN PATENT DOCUMENTS

CN 1195776 10/1998
CN 1233059 A * 10/1999 ............. G11C 29/48
(Continued)

OTHER PUBLICATIONS

International Search Report—PCT/KR2018/006471 dated Sep. 27, 2018.
(Continued)

*Primary Examiner* — Patrick Assouad
*Assistant Examiner* — Demetrius R Pretlow
(74) *Attorney, Agent, or Firm* — Cantor Colburn LLP (57) ABSTRACT

Provided is a measuring method for testing a device under test (DUT) having a plurality of terminals and, particularly, to a means for measuring the functions and performance of various electronic devices in which an electronic circuit such as that in an electronic device, a semiconductor element, a circuit module, and a circuit board is mounted, and to: a method by which a processor supports measurement with software such that unit costs can be reduced to be lower than those of conventional means operating with various, high-cost hardware; and a device using the same.

13 Claims, 7 Drawing Sheets

(56) References Cited

U.S. PATENT DOCUMENTS

| | | | |
|---|---|---|---|
| 5,951,704 A | 9/1999 | Sauer et al. | |
| 5,951,705 A * | 9/1999 | Arkin | G01R 31/31908 714/738 |
| 6,028,439 A * | 2/2000 | Arkin | G01R 31/31907 324/762.02 |
| 6,202,186 B1 * | 3/2001 | Oonk | G01R 31/31921 714/738 |
| 6,255,843 B1 * | 7/2001 | Kurihara | G01R 31/31907 324/762.02 |
| 6,313,657 B1 * | 11/2001 | Hashimoto | G01R 31/319 324/762.02 |
| 6,449,741 B1 * | 9/2002 | Organ | G01R 1/025 714/46 |
| 8,650,524 B1 * | 2/2014 | Chakravadhanula | G06F 30/327 716/114 |
| 8,904,256 B1 * | 12/2014 | Chakravadhanula | G01R 31/318547 714/731 |
| 2002/0069382 A1 * | 6/2002 | Hayashi | G01R 31/319 714/715 |
| 2002/0107654 A1 * | 8/2002 | Mori | G01R 31/319 702/120 |
| 2003/0053358 A1 * | 3/2003 | Kundu | G11C 29/40 365/201 |
| 2003/0099139 A1 * | 5/2003 | Abrosimov | G11C 29/56004 365/200 |
| 2003/0234661 A1 * | 12/2003 | Yamamoto | G01R 31/66 324/754.03 |
| 2004/0056662 A1 * | 3/2004 | Sato | G01R 31/319 324/332 |
| 2004/0093542 A1 * | 5/2004 | Isodono | G01R 31/31926 714/724 |
| 2005/0149803 A1 * | 7/2005 | Hirano | G11C 29/56004 714/738 |
| 2006/0036389 A1 * | 2/2006 | Ozora | G01R 31/31937 702/108 |
| 2006/0168483 A1 * | 7/2006 | Sherlock | G01R 31/31858 714/43 |
| 2016/0091564 A1 * | 3/2016 | Li | G01R 31/318544 714/727 |
| 2018/0045537 A1 * | 2/2018 | Chen | G01D 5/16 |
| 2018/0328990 A1 * | 11/2018 | Pandya | G01R 31/2837 |

FOREIGN PATENT DOCUMENTS

| | | | | | |
|---|---|---|---|---|---|
| CN | 1321892 | A | * | 11/2001 | G11C 29/56 |
| CN | 103558562 | A | * | 2/2014 | G11C 29/48 |
| DE | 19533840 | C1 | * | 3/1997 | G01R 31/023 |
| JP | H09171058 | A | * | 6/1997 | |
| JP | 10062475 | | | 3/1998 | |
| JP | 10160808 | | | 6/1998 | |
| JP | H10319091 | A | * | 12/1998 | G11C 29/56 |
| JP | H1196794 | A | * | 4/1999 | |
| JP | 2000091388 | A | * | 3/2000 | |
| JP | 2004069412 | A | * | 3/2004 | G01R 31/319 |
| JP | 2004279136 | A | * | 10/2004 | |
| JP | 2005182866 | A | * | 7/2005 | G11C 29/56 |
| JP | 2011170691 | A | * | 9/2011 | G11C 29/56 |
| KR | 20010031522 | | | 4/2001 | |
| KR | 20010089599 | | | 10/2001 | |
| KR | 20020033559 | A | * | 5/2002 | G11C 29/56 |
| KR | 20030092599 | A | * | 12/2003 | G11C 29/56004 |
| KR | 20060035360 | A | * | 4/2006 | |
| KR | 101209113 | B1 | * | 12/2012 | G06F 11/27 |
| KR | 20150037002 | | | 4/2015 | |
| KR | 20150126364 | | | 11/2015 | |
| KR | 20160140446 | A | * | 12/2016 | G06F 11/27 |
| WO | WO-8903088 | A1 | * | 4/1989 | G01R 31/318385 |

OTHER PUBLICATIONS

Korean Office Action—Korean Application No. 10-2017-0077892 dated Jan. 3, 2019, citing JP H10-160808, KR 10-2001-0089599 and JP H10-062475.

Chinese Office Action—Chinese Application No. 201880041098.1 dated Jun. 3, 2021, citing KR 2001-0089599, JP H10-160808, and CN1195776.

* cited by examiner

Fig. 1

*Prior Art*

FIG. 2

*Prior Art*

PROCESSOR-BASED MEASURING METHOD FOR TESTING DEVICE UNDER TEST, AND MEASURING DEVICE USING SAME

CROSS-REFERENCE TO RELATED APPLICATIONS

This application is a national entry of PCT Application No. PCT/KR2018/006471 filed on Jun. 7, 2018, which claims priority to and the benefit of Korean Application No. 10-2017-0077892 filed Jun. 20, 2017, in the Korean Patent Office, the entire contents of which are incorporated herein by reference.

TECHNICAL FIELD

This invention relates to a measuring method of testing a device under test (DUT) having a plurality of terminals, and more particularly, to a tool for testing functions and performance of various electronic devices, such as electronic devices, semiconductor devices, circuit modules, circuit boards, and the like, having electronic circuits, and to a method of assisting a test in software by a processor, in order to reduce unit costs, as compared with the conventional tool which is operated by having expensive various hardware, and a device using the same.

BACKGROUND ART

A measuring device is operated by a combination of a microcontroller (or a microprocessor) for instructing preparation of a test for a device under test (DUT) and execution of a test program and several modules (or test units) for actually performing the test.

Figure 1:
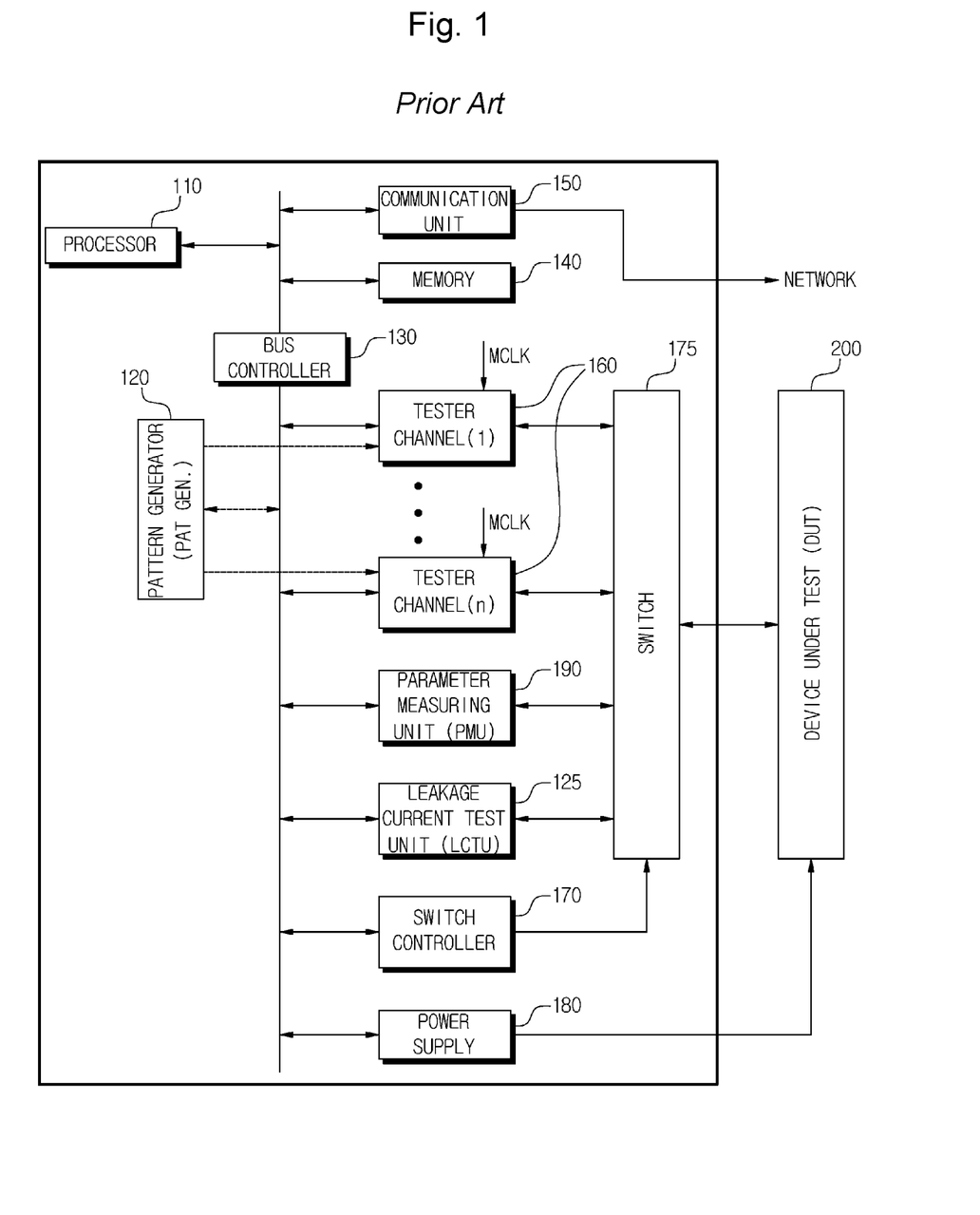
FIG. 1 is a conceptual block diagram illustrating a conventional exemplary measuring device for testing a device under test (DUT).

FIG. 1 is a conceptual block diagram illustrating the conventional exemplary measuring device in order to test a DUT, particularly, a measuring device disclosed in U.S. Pat. No. 6,028,439.

According to the conventional measuring tool, the measuring device disclosed in U.S. Pat. No. 6,028,439 includes physical measuring devices such as a microcontroller 110 (microprocessor), a pattern generator 120 (PAT GEN.) for generating a test pattern, a leakage current test unit 125 (LCTU) for measuring a leakage current, a power supply 180 (device power supply) for supplying a voltage to a DUT, a period generator (not shown) (Period Gen.) for generating a clock, and the like.

In such a measuring tool, the microcontroller 110 is responsible for a test instruction and control, and a test is performed by the expensive physical measuring devices. This increases a volume of the measuring device such that there is a disadvantage of increasing a manufacturing cost.

Figure 2:
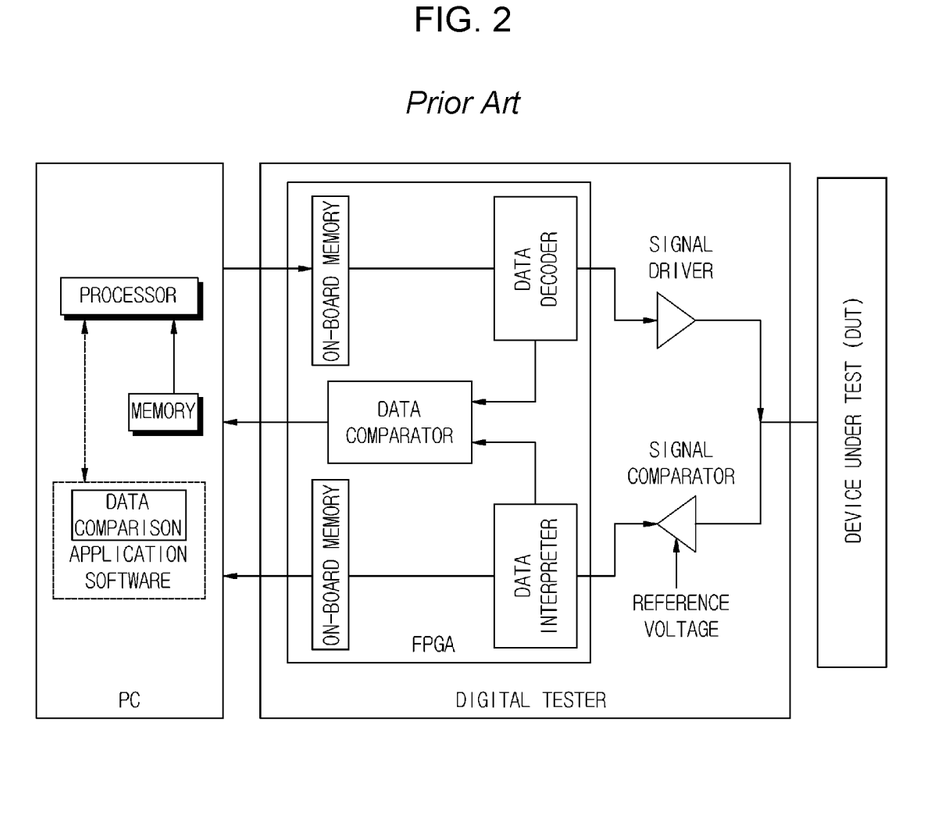
FIG. 2 is a conceptual block diagram illustrating an exemplary test unit of National Instruments which reduces a volume and a manufacturing cost of a conventional measuring device such as the measuring device according to FIG. 1.

As another example of a measuring device for supplementing such a disadvantage, a measuring device of National Instruments has a configuration as shown in FIG. 2. The measuring device has a personal computer (PC) separate from a digital tester performing a test and selectively uses a method of comparing an output signal of a DUT measured by the digital tester with an expected value using application software which is executed on the PC.

However, owing to a delay time in a process in which the digital tester transmits test data to the PC and stores the test data in a memory, a delay time in a process in which application software reads the stored data and performs data comparison, and a delay time due to execution of the application software, the above method has a problem in that comparing and analyzing test results in real time is difficult and thus the above method is not suitable for a high-speed test. Thus, using a separate physical data comparator device for real-time data comparison is recommended.

Further, in the example of the measuring device of National Instruments, the tool replacing a physical test unit using the application software is limited to the data comparison so that the above method alone has a limitation in miniaturization of the measuring device and reduction of a manufacturing cost thereof.

SUMMARY OF INVENTION

Technical Problem

The present invention is directed to providing a new measuring tool which avoids a conventional measuring method having and using a separate physical tool for measuring, comparing, and analyzing pattern generation, a leakage current, an analog signal, and the like, and in which a microprocessor is in connection with a pattern generation task and a real-time data conversion and analysis task in real time, thereby replacing the use of physical measuring modules such as a pattern generator, a leakage current test device, and an analog signal processing device.

The present invention is also directed to providing a measuring tool which is capable of collecting and examining instruction data output from a microprocessor, test data generated during a test process, a final determination result, analysis data, and the like in real time. In other words, the present invention is also directed to providing a tool for allowing a user to analyze a test process and a result thereof at any time even when a test is underway or even after the test is terminated such that, when malfunction occurs in a test target, a tool for assisting a cause analysis on the malfunction and/or close examination on a level of the result is provided.

Solution to Problem

The characteristic constitution of the present invention for achieving the above-described objectives of the present invention and realizing the characteristic effects thereof, which will be described below, is as follows.

One aspect of the present invention provides a processor-based measuring method of testing a device under test (DUT) having a plurality of terminals, which includes (a) performing, by a processor, (i) a process of acquiring a power setting signal and a switch setting signal and (ii) a process of providing a test pattern table; (b) when the test pattern table is provided, transmitting, by the processor, a test start signal to a bus controller such that the bus controller opens a bus; and (c) when the bus is opened, performing (i) a process in which the processor performs a test on a DUT by putting the test pattern table, the power setting signal, and the switch setting signal on the bus together with a test order number to be respectively transmitted to a tester channel, a switch controller, and a power supply such that the tester channel applies a pattern signal according to the test pattern table to the DUT, the power supply applies a power supply voltage according to the power setting signal to the DUT, and the switch controller controls the switch interposed between the tester channel and the DUT according to the switch setting signal.

Another aspect of the present invention provides a processor-based measuring method of testing a device under test (DUT) having a plurality of terminals, which includes (a) performing, by a processor, (i) a process of acquiring a power setting signal and a switch setting signal and (ii) a process of providing a test pattern table for a specific test; (b) when the test pattern table is provided, performing (i) a process in which the processor performs a specific test on a DUT by putting the test pattern table, the power setting signal, and the switch setting signal on a bus together with a test order number to be respectively transmitted to a tester channel, a switch controller, and a power supply such that the tester channel applies a pattern signal according to the test pattern table to the DUT, the power supply applies a power supply voltage according to the power setting signal to the DUT, and the switch controller controls the switch interposed between the tester channel and the DUT according to the switch setting signal; and (c) when test data is acquired from the DUT by the test, determining, by the processor, whether the DUT is non-defective or defective by comparing a test value, (i) which is the test data or (ii) which is calculated from the test data through a software module executed by the processor, with an expected value according to the specific test.

Here, operation (c) of the measuring method may preferably further include (c1), when a calculation through the software module is required so as to acquire the test value, calculating, by the processor, the test value through the software module from the test data and, when the calculation through the software module is not required, determining, by the processor, whether the DUT is non-defective or defective using the test data as the test value, and prior to operation (c1), operation (c) further includes (c0) starting, by the processor, repetition of operations (a) to (c) for another test different from the specific test.

Still another aspect of the present invention provides a processor-based measuring device for testing a device under test (DUT) having a plurality of terminals, which includes a processor configured to perform a process of acquiring a power setting signal and a switch setting signal and a process of providing a test pattern table and configured to generate a test start signal when the test pattern table is provided, a bus connected to the processor, a bus controller configured to open the bus when receiving the test start signal from the processor, at least one tester channel configured to apply a pattern signal according to the acquired test pattern table, which is put on the bus, to a DUT, a switch interposed between the at least one tester channel and the DUT, a power supply configured to apply a power supply voltage according to the acquired power setting signal, which is put on the bus, to the DUT, and a switch controller configured to control the switch according to the acquired switch setting signal which is put on the bus, wherein, when the bus is opened, the processor performs a test on the DUT by putting the test pattern table, the power setting signal, and the switch setting signal on the bus together with a test order number to be respectively transmitted to the at least one tester channel, the switch controller, and the power supply.

Advantageous Effects of Invention

In accordance with the present invention, a measuring method implemented in software that can replace a conventional measurement method with high hardware dependency is provided and thus occupation of hardware of the measuring device can be reduced in a measuring device such that there is an effect of reducing costs of miniaturization and manufacturing of the measuring device.

Further, in accordance with the present invention, there is an effect which is capable of providing a function of analyzing and storing various signals and results, which are generated during a test process, in real time by utilizing performance of a processor and a communication unit of which performance has recently been significantly developed. Consequently, there is an advantage in that the function of the measuring device, which remains in a test in the related art, can extend to a real-time data analysis area.

BRIEF DESCRIPTION OF DRAWINGS

The accompanying drawings, which are attached below to be used in the description of the embodiments of the present invention, are merely some of the embodiments of the present invention and may be used by those skilled in the art (hereinafter, a "skilled person") to which the present invention pertains. Other drawings may be acquired on the basis of these accompanying drawings without inventive work being realized.

DETAILED DESCRIPTION OF EMBODIMENT

In the following detailed description, in order to clarify the objectives, technical solutions, and advantages of the present invention, reference is made to the accompanying drawings that show, by way of illustration, specific embodiments in which the present invention may be practiced. These embodiments are described in sufficient detail to enable a skilled person to practice the present invention.

Further, throughout the description and claims of the present invention, the term "comprising" and variations thereof are not intended to exclude other technical features, additives, components, or steps. Other objectives, advantages, and features of the present invention will become apparent to a skilled person, in part from this description and in part from the practice of the invention. The following examples and drawings are provided by way of illustration and are not intended to limit the present invention.

Further, the present invention encompasses all possible combinations of the embodiments described herein. It should be understood that various embodiments of the present invention, although different, are not necessarily mutually exclusive. For example, specific forms, structures, and characteristics described herein in connection with one embodiment may be implemented within other embodiments without departing from the spirit and scope of the present invention. Further, it should be understood that the location or arrangement of individual elements within each disclosed embodiment may be modified without departing from the spirit and scope of the present invention. The following detailed description, therefore, is not to be taken in a limiting sense, and the scope of the present invention is defined only by the appended claims, appropriately interpreted, along with the full range of equivalents to which the claims are entitled. In the drawings, like numerals refer to the same or similar functionality throughout the several views.

Unless otherwise indicated herein or clearly contradicted by context in this disclosure, an item referred to as the singular encompasses the plural unless the context otherwise requires. Also, in the following description of the present invention, when a detailed description of related known configurations or functions is determined to obscure the gist of the present invention, the detailed description thereof will be omitted herein.

Hereinafter, exemplary embodiments of the present invention will be described in detail with reference to the accompanying drawings so as to enable a skilled person to easily practice the present invention.

Figure 3A:
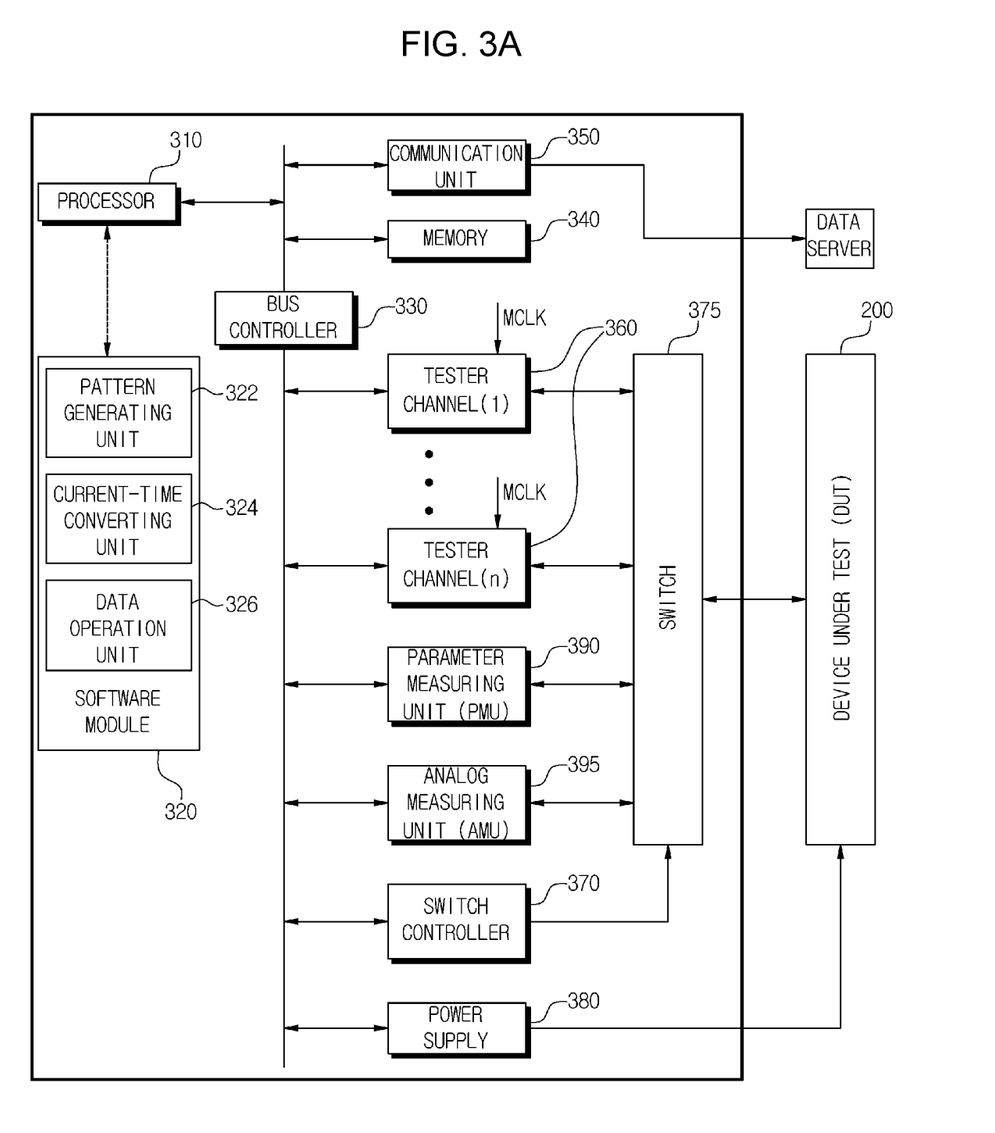
FIG. 3A is a block diagram illustrating a processor-based measuring device for testing a DUT having a plurality of terminals according to one embodiment of the present invention.
Figure 3B:
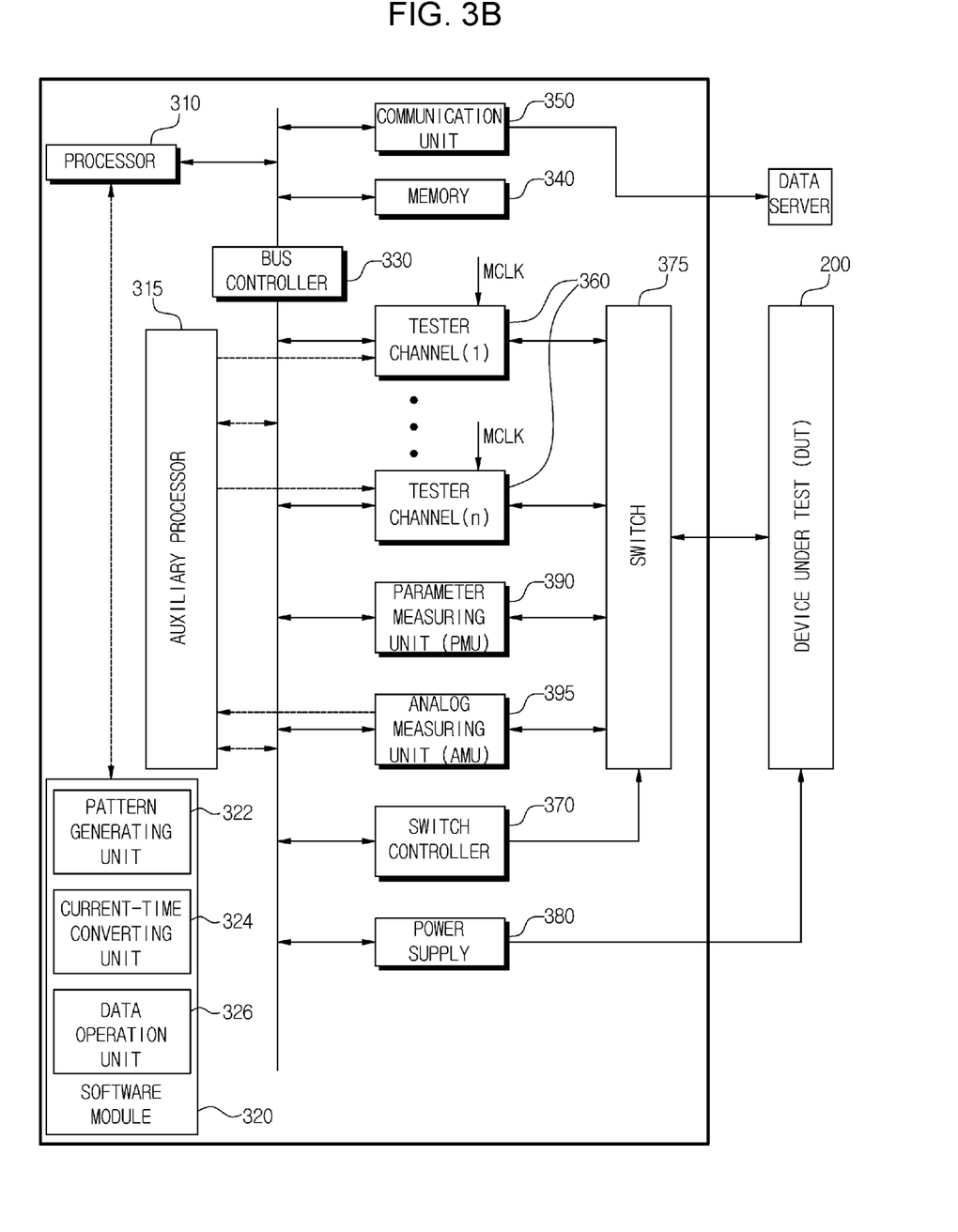
FIG. 3B is a block diagram illustrating a processor-based measuring device for testing a DUT having a plurality of terminals according to another embodiment of the present invention.

FIG. 3A is a block diagram illustrating a processor-based measuring device for testing a DUT having a plurality of terminals according to one embodiment of the present invention, and FIG. 3B is a block diagram illustrating a processor-based measuring device for testing a DUT having a plurality of terminals according to another embodiment of the present invention.

Referring to FIG. 3A, the processor-based measuring device according to the present invention includes a processor 310, a bus connected to the processor 310, a bus controller 330, a communication unit 350 connected to the bus, at least one tester channel 360, a switch 375, a switch controller 370, and a power supply 380. The measuring device according to the present invention may further include at least one among a memory 340, a parameter measuring unit (PMU) 390, and an analog measuring unit (AMU) 395 as necessary.

To briefly describe the measuring device first so as to describe a measuring method according to the present invention, the processor 310 is a component which performs functions of testing, calculating, determining, and analyzing in performing the measuring method according to the present invention, and a software module 320 is a component which is executed by the processor 310 to perform the above functions. The bus serves to transmit data between individual components included in the measuring device as a digital signal, and opening or blocking of the bus is controlled by the bus controller 330. The memory 340 stores signals required for testing or store test data acquired as a result of the test. The communication unit 350 performs a function of transmitting the signals to an external device so as to preserve at least a part of the signals which are transmitted through the bus by the external device. The processor 310 may control opening or blocking of the communication port of the communication unit 350 according to starting or ending of the test. Further, the processor 310 may instruct the bus controller 330 to control the bus controller 330 to control the opening or blocking of the bus according to the starting or ending of the test. The tester channel 360 may apply an input signal to a DUT 200 and obtain an output signal therefrom. The switch 375 may be interposed between the tester channel 360 and a terminal of the DUT 200. The switch controller 370 may control opening or closing of the switch 375 according to a switch setting signal. The power supply 380 applies a power supply voltage to the DUT 200 according to a power setting signal. The PMU 390 performs a function of measuring a voltage and a current of a power terminal or a specific signal terminal of the DUT, and the AMU 395 performs a function of measuring an analog signal which will be described below.

Operations of the above components of the measuring device according to the present invention will be described in more detail below.

Referring to FIG. 3B, the processor-based measuring device according to the present invention may include a separate auxiliary processor 315 in addition to the processor 310.

Figure 4:
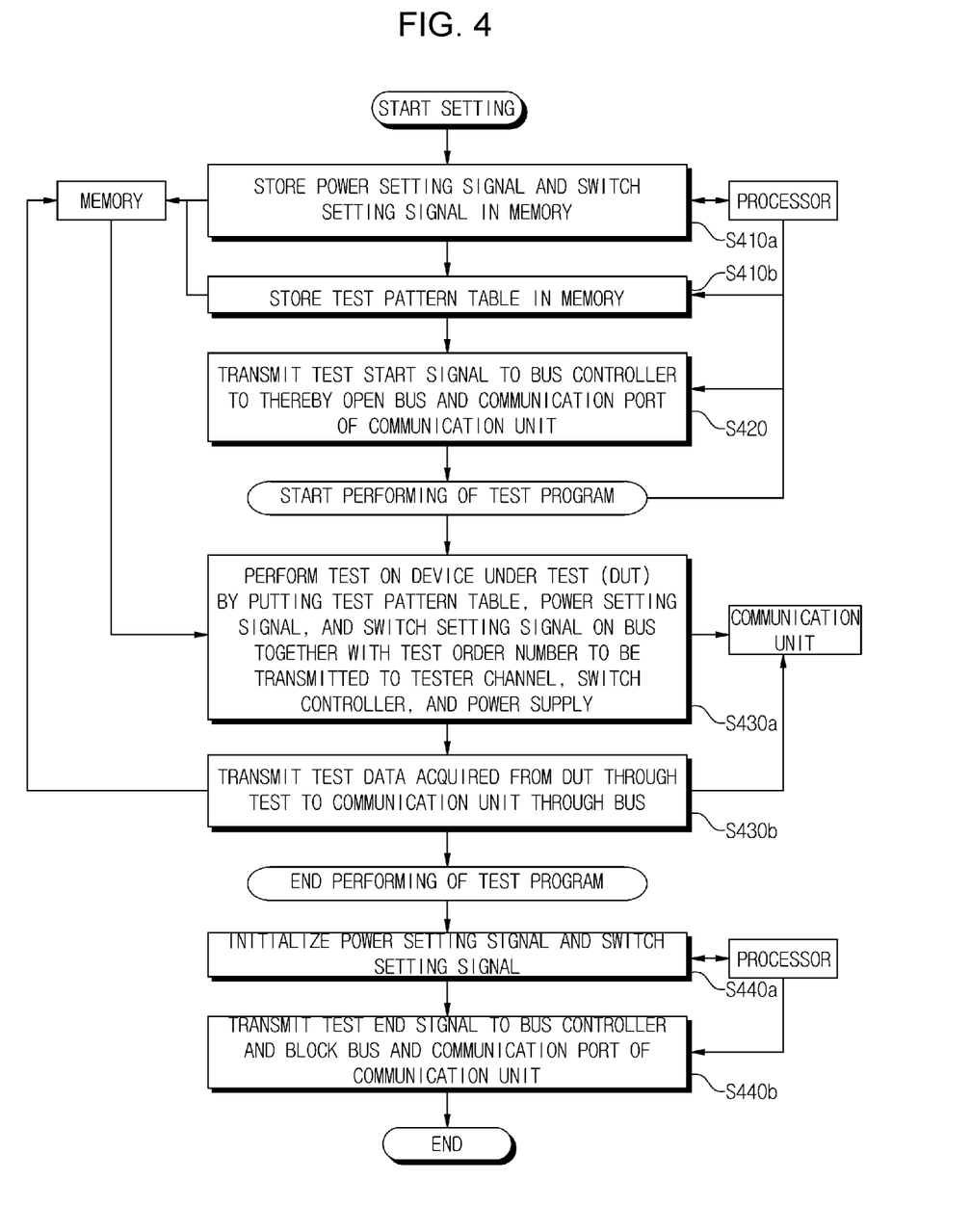
FIG. 4 is an exemplary flowchart illustrating a processor-based measuring method of testing a DUT having a plurality of terminals according to the present invention.

A flow of performing a test using the above measuring device according to the present invention will be described in detail with reference to FIG. 4. FIG. 4 is an exemplary flowchart illustrating the processor-based measuring method of testing a DUT having a plurality of terminals according to the present invention (hereinafter, referred to as a "measuring method").

Referring to FIG. 4, the measuring method according to the present invention includes an operation S410 (not shown) including operations S410a and S410b performing (i) a process of obtaining, by the processor 310, a power setting signal and a switch setting signal (S410a), and (ii) a process of providing, by the processor 310, a test pattern table (S410b).

Preferably, the test pattern table may be imported from a test program or an external file by the processor 310 or generated in a software manner by the software module 320 which is executed by the processor 310.

For example, in connection with a program of the software module 320, which is executed by the processor 310, particularly, in connection with one embodiment in which a pattern generating unit 322 of the software module 320 generates a pattern required for a test, i.e., the test pattern table, when the DUT is a memory chip, as a test pattern for testing the memory chip, an algorithm for generating a March X pattern, which is one among test patterns with respect to a memory cell array having five addresses, and a pattern table generated by applying the same will be described below.

A memory cell inspection order of the March X pattern is as follows. First, "0" is written in an entirety of a memory cell array, it is sequentially checked whether data of each cell is "0," and then data of "1" is written in each cell. After the above process is completed, the data of the entirety of the cell array is changed to "1." Then, after whether the data of each cell is 1 is sequentially checked, data of "0" is written. The above pattern is used to determine whether data in adjacent cells is damaged or data in a specific cell is damaged in a process of reading or writing the data in the specific cell, which is different from the data in the adjacent cells. The above pattern is one among widely used patterns for memory cell inspection and is well known to the skilled person.

An algorithm of a deployment process is briefly described as follows.

A first operation is that an address of a first cell is designated, "0" is written in the all cell, and the address is sequentially increased to write "0" in all cells. In this case, a write enable (WE) signal and an output enable (OE) signal are respectively maintained in an ON state and an OFF state. Here, the WE signal is a signal for allowing data writing in a memory cell, and the OE signal is a signal for allowing data reading from the memory cell.

A second operation is that data "0" is read and data "1" is written up to a last cell by designating the address of the first cell, reading data "0," writing data "1," and sequentially increasing the address. In this case, each of the OE signal and the WE signal repeats an ON-to-OFF state and an OFF-to-ON state.

A third operation is that data "1" is read and data "0" is written up to the first cell by designating an address of the last cell, reading data "1," writing data "0," and sequentially decreasing the address. In this case, each of the OE signal and the WE signal repeats an ON-to-OFF state and an OFF-to-ON state.

A fourth operation is that data "0" is read from all the cells by designating the address of the last cell, reading data "0," and sequentially decreasing the address. In this case, the WE signal and the OE signal are respectively maintained in an OFF state and an ON state.

An example of a pattern table for each stage, which is derived by the pattern generating unit 322 of the software module 320 executed by the processor 310 according to the above algorithm, is enumerated below. Each pattern field is comprised of an order, an address, data, a control signal, and a clock. Here, the program of the software module 320 is executed in an environment of a general operating system such as Linux or Windows, and thus a detailed description thereof will be omitted herein.

TABLE 1

| | Address | | | | | Data | Control signal | | Clock |
|---|---|---|---|---|---|---|---|---|---|
| Order | x0 | x1 | x2 | x3 | x4 | D0 | WE | OE | MCLK |
| 1 | 0 | 0 | 0 | 0 | 0 | 0 | 1 | 0 | 1 |
| 2 | 0 | 0 | 0 | 0 | 1 | 0 | 1 | 0 | 1 |
| 3 | 0 | 0 | 0 | 1 | 0 | 0 | 1 | 0 | 1 |
| 4 | 0 | 0 | 0 | 1 | 1 | 0 | 1 | 0 | 1 |
| . | . | . | . | . | . | . | . | . | . |
| . | . | . | . | . | . | . | . | . | . |
| . | . | . | . | . | . | . | . | . | . |
| 31 | 1 | 1 | 1 | 1 | 0 | 0 | 1 | 0 | 1 |
| 32 | 1 | 1 | 1 | 1 | 1 | 0 | 1 | 0 | 1 |

TABLE 2

| | Address | | | | | Data | Control signal | | Clock |
|---|---|---|---|---|---|---|---|---|---|
| Order | x0 | x1 | x2 | x3 | x4 | D0 | WE | OE | MCLK |
| 1 | 0 | 0 | 0 | 0 | 0 | 0 | 0 | 1 | 1 |
| 2 | 0 | 0 | 0 | 0 | 0 | 1 | 1 | 0 | 1 |
| 3 | 0 | 0 | 0 | 0 | 1 | 0 | 0 | 1 | 1 |
| 4 | 0 | 0 | 0 | 0 | 1 | 1 | 1 | 0 | 1 |
| . | . | . | . | . | . | . | . | . | . |
| . | . | . | . | . | . | . | . | . | . |
| . | . | . | . | . | . | . | . | . | . |
| 31 | 1 | 1 | 1 | 1 | 0 | 0 | 0 | 1 | 1 |
| 32 | 1 | 1 | 1 | 1 | 1 | 1 | 1 | 0 | 1 |

TABLE 3

| | Address | | | | | Data | Control signal | | Clock |
|---|---|---|---|---|---|---|---|---|---|
| Order | x0 | x1 | x2 | x3 | x4 | D0 | WE | OE | MCLK |
| 1 | 1 | 1 | 1 | 1 | 1 | 1 | 0 | 1 | 1 |
| 2 | 1 | 1 | 1 | 1 | 1 | 0 | 1 | 0 | 1 |
| 3 | 1 | 1 | 1 | 1 | 0 | 1 | 0 | 1 | 1 |
| 4 | 1 | 1 | 1 | 1 | 0 | 0 | 1 | 0 | 1 |
| . | . | . | . | . | . | . | . | . | . |
| . | . | . | . | . | . | . | . | . | . |
| . | . | . | . | . | . | . | . | . | . |
| 31 | 0 | 0 | 0 | 0 | 0 | 1 | 0 | 1 | 1 |
| 32 | 0 | 0 | 0 | 0 | 0 | 0 | 1 | 0 | 1 |

TABLE 4

| | Address | | | | | Data | Control signal | | Clock |
|---|---|---|---|---|---|---|---|---|---|
| Order | x0 | x1 | x2 | x3 | x4 | D0 | WE | OE | MCLK |
| 1 | 1 | 1 | 1 | 1 | 1 | 0 | 0 | 1 | 1 |
| 2 | 1 | 1 | 1 | 1 | 1 | 0 | 0 | 1 | 1 |
| 3 | 1 | 1 | 1 | 1 | 0 | 0 | 0 | 1 | 1 |
| 4 | 1 | 1 | 1 | 1 | 0 | 0 | 0 | 1 | 1 |
| . | . | . | . | . | . | . | . | . | . |
| . | . | . | . | . | . | . | . | . | . |
| . | . | . | . | . | . | . | . | . | . |
| 31 | 0 | 0 | 0 | 0 | 0 | 0 | 0 | 1 | 1 |
| 32 | 0 | 0 | 0 | 0 | 0 | 0 | 0 | 1 | 1 |

Unlike a conventional method, the derived pattern is directly transmitted to the tester channel 360 through the bus controller 330 without going through a pattern generator (not shown). In this case, the power setting signal and the switch setting signal are also transmitted to the tester channel 360, signals according to the power setting signal and the switch setting signal are applied to the DUT 200 through the power supply 380 and the switch controller 370 so that a test according to the present invention is performed. A detailed flow thereof will be described below.

In operation S410, the power setting signal, the switch setting signal, and the test pattern table may preferably be stored in the memory 340 of a measuring device 300.

Referring to FIG. 4 again, when the test pattern table is provided, the measuring method according to the present invention further includes transmitting, by the processor 310, a test start signal to the bus controller 330 and the communication unit 350, thereby opening the bus through the bus controller 330 and a communication port of the communication unit 350 connected to the bus (3420).

Next, when the bus and the communication port of the communication unit 350 are opened, the measuring method according to the present invention further includes operations S430 (not shown) including operations S430*a*, and S430*b* of performing (i) a process S430*a* in which the processor 310 performs a test on the DUT by putting the test pattern table, the power setting signal, and the switch setting signal on the bus together with a test order number, thereby transmitting the test pattern table, the power setting signal, and the switch setting signal to the tester channel 360, the switch controller 370, and the power supply 380, respectively, and (ii) a process S430*b* in which the processor 310 assists test data acquired from the DUT through the test to be transmitted to the communication unit 350 through the bus.

Here, the "test" may include an individual test performed through at least one tester including the PMU 390, the AMU 395, and the like.

Specifically, the process (S430a) is performed such that the tester channel 360 applies a pattern signal according to the test pattern table to the DUT, the power supply 380 applies a power supply voltage according to the power setting signal to the DUT, and the switch controller 370 controls the switch 375 interposed between the tester channel 360 and the DUT according to the switch setting signal.

In an embodiment in which the power setting signal, the switch setting signal, and the test pattern table are stored in the memory 340, in operation S430, the test pattern table, the power setting signal, and the switch setting signal, which are stored in the memory 340, may be put on the bus together with the test order number from the memory 340.

Meanwhile, the process (S430b) is intended to store pieces of test information in real time which are technical features of the measuring method and the measuring device according to the present invention.

That is, another feature of the present invention is that the test information is provided in real time so as to analyze a failure cause of the DUT. Information on the test pattern table and instruction information related thereto, which are generated by the processor 310, e.g., the power setting signal, the switch setting signal, and the test sequence number are put on the bus and transmitted to the tester channel 360 through the bus controller 330. Further, test results collected in the tester channel 360 are transmitted to the processor 310 through the bus via the bus controller 330. Here, the bus controller 330 is opened at the beginning of a test according to an instruction of the processor 310 and blocked at the end of the test. As described above, all the signals, which are transmitted and received in a process from the beginning of the test to the end thereof, and test order numbers of the test program may be put on the bus, and all the signals may be written in the memory 340 in real time. Further, all the signals may be stored in an external server through the communication unit 350.

In summary, in performing the test according to the present invention, (1) at least some of the signals, which are put on the bus and transmitted, may be written in the memory 340 or a predetermined storage device in real time, or (2) at least some of the signals may be preserved by an external device, e.g., a data server, through the communication unit 350. Alternatively, the above (1) and (2) may be compatible.

Next, still another feature of the measuring method according to the present invention is that the processor 310 may calculate a characteristic value of an analog signal from the test data.

Specifically, although a conventional analog measuring device is generally comprised of a test unit and a calculation unit, in operation S430 of the present invention, the tester channel 360 or the tester channel 360 and the AMU 395 are responsible for an analog test with respect to the DUT 200. The measured test data is transmitted to the processor 310 through the bus controller 330, and the processor 310 performs a calculation on a characteristic value of an analog signal which is required to be calculated from the received test data so that a data operation unit 326 of the software module 320 executed by the processor 310 may perform the calculation.

The characteristic value of the analog signal may include at least one among, for example, accuracy, resolution, a dynamic range, an offset error, a gain error, differential nonlinearity, and integral nonlinearity, but the skilled person will understand that the present invention is not limited thereto.

More specifically, an example of an analog test process will be described below. First, prior to the test process, the DUT 200 is set to a standby state by applying a digital signal to the DUT 200 through the tester channel 360. Then, the test process may be deployed in the following two methods according to a combination of, for example, input and output signals applied to the DUT 200.

First, when a digital signal is input and an analog signal is output, the digital signal is input to the DUT 200 through a corresponding tester channel 360, and the analog signal output from the DUT 200 is acquired by the AMU 395. The AMU 395 converts the measured analog signal into a digital signal and transmits the measured data, which is the result of the conversion, to the processor 310, and the data operation unit 326 of the software module 320 executed by the processor 310 performs a comparison between the measured data and an expected value, extracts a characteristic value of the above-described analog signal to examine whether a corresponding standard is satisfied, and determines whether the DUT 200 is non-defective or defective.

Second, when an analog signal is input and a digital signal is output, the analog signal is applied to the DUT 200 through the AMU 395, and the digital signal output from the DUT 200 as a response to the application of the analog signal is transmitted to the processor 310 through the tester channel 360 as the measured data. The data operation unit 326 of the software module 320 executed by the processor 310 performs a comparison between the measured data and an expected value, extracts a characteristic value of the analog signal to examine whether a corresponding standard is satisfied, and determines whether the DUT 200 is non-defective or defective.

Further, yet another feature of the measuring method according to the present invention is that a current-time converting unit 324 included in the software module 320 executed by the processor 310 may test a leakage current.

To describe the test of the leakage current in detail, since an amount of the leakage current is proportional to a time at which an amount of charges charged at a test terminal with respect to the DUT is discharged, when a voltage applied to the test terminal first is V, capacitance of the test terminal is C, and a current is I, $i=dQ/dt=C*dV/dt$, i.e., a variance in voltage (or a variance in charging and discharging) and a variance in time spent in a variation may be measured to calculate the leakage current. Alternatively, when a current flows, it is possible to calculate a voltage applied to a resistor from $i=V/R$. Such an indirect current measuring method requires a calculation regarding measured data, and the current-time converting unit according to the present invention performs such a function.

More specifically, an example of a process of measuring a leakage current will be described below. First, the processor 310 applies a control signal to the DUT 200 through the tester channel 360 to set the DUT 200 to be in a standby state and apply a predetermined voltage (first voltage) to terminals of the DUT 200. Thereafter, the tester channel 360 is switched to a state in which an output terminal of the tester channel 360 is in an OFF state, i.e., a Hi-Z state, and, simultaneously, the test during the above-described time begins. The tester channel 360 specifies time spent until the voltage applied to the DUT 200 is varied so as to reach a reference voltage (second voltage) due to the leakage current of the terminal of the DUT 200 to transmit time data to the processor 310. The processor 310 receiving the time data may calculate the leakage current using a constant which is predetermined in a test design stage, i.e., a capacity of capacitance connected to the terminal of the DUT 200, the applied voltage (first voltage), the reference voltage (second voltage), and the above-described current relational expression on the basis of the spent time.

In summary, in the present invention, in order to test the leakage current in the tester channel 360, time spent when a voltage is varied as compared to a predetermined voltage variance is measured with respect to the test terminal connected to the DUT, the measured time data which is the measured result of the spent time is transmitted to the processor 310 through the bus controller 330, and the processor 310 may calculate the leakage current from the received time data by setting the capacitance value of the test terminal, which is already set in the design stage, and the voltage variance as constants.

According to the test of the present invention, in operation S430 including the test of the leakage current according to one embodiment of the measuring method of the present invention, when time spent in leakage of the leakage current is measured, the processor 310 may test the leakage current by performing a process of converting the time spent in the leakage into the leakage current through the software module 320 executed by the processor 310.

Next, referring to FIG. 4, the measuring method according to the present invention may further include operations S440 (not shown) including operations S440a, and S440b of performing, when the test is completed, (i) a process (S440a) of initializing, by the processor 310, the power setting signal and the switch setting signal, and (ii) a process (S440b) of transmitting, by the processor 310, a test end signal to the bus controller 330 and the communication unit 350 to block the bus through the bus controller 330 and block the communication port of the communication unit 350. Consequently, one flow of the measuring method according to the present invention is terminated.

The measuring method according to the present invention may be constituted of a program in which a series of tests with respect to the DUT 200 are continued.

The test with respect to a typical DUT 200, particularly, a semiconductor, is performed by being comprised of about one hundred programs based on items enumerated in Table 5 below, and the skilled person will easily understand that the "program" corresponds to a "test vector" which is a term commonly used in the art to which the present invention pertains.

TABLE 5

| Number | Test item |
|---|---|
| 1 | Power supply terminal abnormality test |
| 2 | Leakage current test |
| 3 | Scan |
| 4 | Built-in self test (BiST) |
| 5 | Analog (ADC/DAC) |
| 6 | Input/output voltage test |
| 7 | Operating function test |
| 8 | Operating speed test |
| 9 | Dynamic/static current test of DUT |

To describe the programs in brief with reference to Table 5, two programs may be operated to test a leakage current in power and ground orientations.

In addition, the Scan is a "logical test circuit" which is specially installed in a semiconductor chip so as to test whether a logic circuit fails and is comprised of dozens of circuits. A Scan test program may also be comprised of dozens of programs to correspond to the Scan. The Scan is a dedicated circuit which is not necessary for a semiconductor function but is purely installed for the purpose of testing abnormality of a logic circuit, and the Scan occupies about 10% of a semiconductor area. The reason for including the Scan circuit in a chip design with the burden of an increase in chip area and in manufacturing cost is that, when the Scan circuit is omitted, the number of semiconductor functional test items may be innumerably increased, and, nevertheless, it may be difficult to find a circuit abnormality generated due to a defect in a semiconductor process. For example, in the case of a communication chip with more than 100 million transistors, driving all the transistors to check abnormalities thereof may innumerably increase the number of functional tests and may become a cause of increasing manufacturing costs.

Further, the BiST is a "memory test circuit" which is specially installed so as to test whether a memory circuit in a chip fails.

Generally, hundreds of memories are installed in a chip, and, when the BiST is used, the hundreds of memories may be tested by being grouped into dozens of units. Owing to the installation of the above test circuit, a chip area is somewhat increased. However, like the Scan, when the BiST circuit is omitted, innumerous test programs are required and a test time also becomes a great burden.

Next, the analog test is generally comprised of several programs which are different according to a design of the DUT. The operating function test is a direct function test with respect to a circuit which is used by the DUT to implement an actual function and is generally comprised of dozens of test programs and applied. The operating speed test generally tests whether execution speeds of most time-consuming programs among the operating function test programs are within a standard and is comprised of several programs.

Meanwhile, each of the input/output voltage test and the dynamic/static current test of the DUT is also comprised of several programs.

Figure 5A:
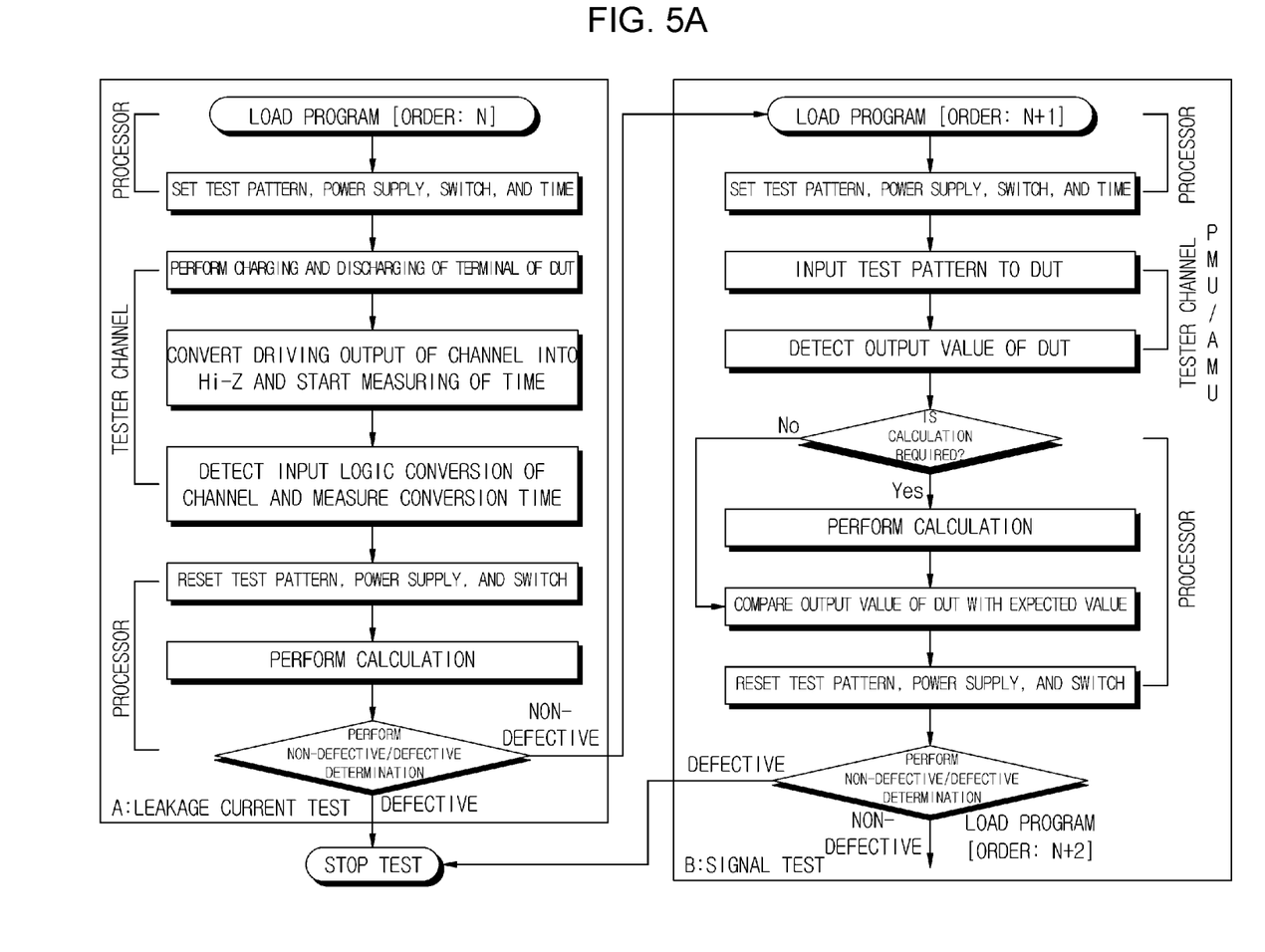
FIG. 5A is an exemplary flowchart illustrating a modified example of sequentially performing a leakage current test and a signal test in performing the processor-based measuring method of testing a DUT having a plurality of terminals according to the present invention.
Figure 5B:
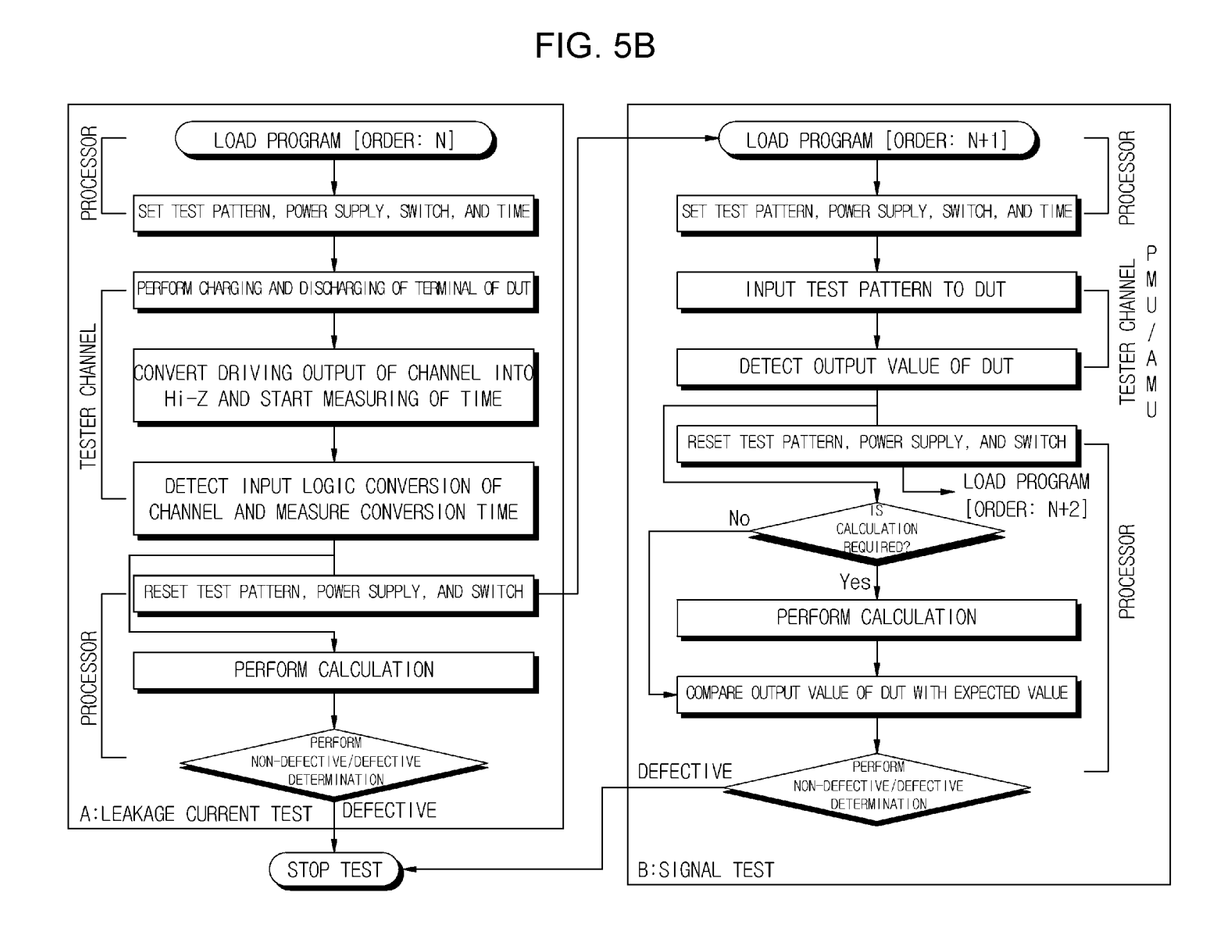
FIG. 5B is an exemplary flowchart illustrating a modified example of combinationally performing a leakage current test and a signal test in performing the processor-based measuring method of testing a DUT having a plurality of terminals according to the present invention.

FIG. 5A is an exemplary flowchart illustrating a modified example of sequentially performing a leakage current test and a signal test (hereinafter, referred to as a "sequential test method") in performing the processor-based measuring method of testing a DUT having a plurality of terminals according to the present invention, and FIG. 5B is an exemplary flowchart illustrating a modified example of combinationally performing a leakage current test and a signal test (hereinafter, referred to as a "combinational test method") in performing the processor-based measuring method of testing a DUT having a plurality of terminals according to the present invention.

Here, the signal test corresponds to Items 3 to 5, 7, and 8 among Items shown in Table 5, and thus, in this disclosure, the signal test is called a digital signal test or an analog signal test. A signal test program for performing the digital signal test or the analog signal test refers to a program which is made according to a language of the measuring device by the skilled person in the art to which the present invention pertains on the basis of a test vector comprised of input signal information, a test condition, and an expected value which are provided by chip designers. Here, the expected value refers to information that the DUT will output some response with respect to a given input signal. In the case of a signal test, the information corresponds to a state of "0," "1," "Hi-Z," or the like, and, in the case of a parameter test, the information corresponds to information which will have a distribution within a predetermined range. In the present invention, a non-defective/defective product determination means that, when the expected value coincides with the test value, it is determined as a non-defective product, and, when the expected value does not coincide with the test value, it is determined as a defective product.

However, the above-described PMU 190 is used to test which value, such as a voltage or a current, is acquired instead of a predetermined value. Accordingly, when the test value is satisfied to be within a standard (an upper limit and/or a lower limit), the non-defective/defective product determination determines a product as a non-defective product, and, when the test value is out of the standard, the non-defective/defective product determination determines the product as a defective product.

Meanwhile, the leakage current test is performed on all input/output terminals of the DUT and is performed such that only a leakage current of the input/output terminal is tested instead of an internal circuit of the DUT. Thus, the leakage current test is different from the above-described signal test which is a test with respect to the internal circuit of the DUT and in which various terminals are used according to which circuit will be tested, i.e., which test program will be applied.

The sequential test method and the combinational test method will be described below with reference to FIGS. 5A and 5B respectively.

The sequential test method is a typical test method in which, when a series of test programs are executed, one test is completed and then a subsequent test is sequentially performed.

FIG. 5A illustrates a process in which the leakage current test and the digital (or analog) signal test are sequentially performed according to the sequential test method. When a leakage current test program is started, the processor 310 instructs and sets operating conditions of test units, and the test units such as the tester channel, the PMU, and the AMU apply signals to the DUT 200 and receive output data and transmit the output data to the processor 310. The processor 310 initializes the test units which terminate the tests and performs an arithmetic operation and the non-defective/defective determination on the basis of the transmitted output data. Then, the processor 310 starts the digital (or analog) signal test.

In summary, a first measuring method according to the above sequential test method includes a first operation of performing, by the processor, (i) a process of acquiring a power setting signal and a switch setting signal and (ii) a process of providing a test pattern table for a specific test, and when the test pattern table is provided, a second operation of performing, by the processor, (i) a process of the specific test on the DUT in a manner in which the test pattern table, the power setting signal, and the switch setting signal are put on the bus together with the test order number to be respectively transmitted to the tester channel, the switch controller, and the power supply such that the tester channel applies a pattern signal according to the test pattern table to the DUT, the power supply applies a power supply voltage according to the power setting signal to the DUT, and the switch controller controls the switch interposed between the tester channel and the DUT according to the switch setting signal, and when test data is acquired from the DUT by the above test, a third operation of determining, by the processor, whether the DUT is non-defective or defective by comparing the test value, (i) which is the test data or (ii) which is calculated from the test data through a software module executed by the processor, with the expected value according to the specific test.

On the other hand, the combinational test method is a test method in which, when the series of test programs are performed, a subsequent test is simultaneously performed with one test before the one test is completed.

FIG. 5B illustrates a process in which the leakage current test and the digital (or analog) signal test are simultaneously performed according to the combinational test method. When the leakage current test program is started, the processor 310 instructs and sets the operating conditions of test units, and the test units such as the tester channel, the PMU, and the AMU apply signals to the DUT 200 and receive output data and to transmit the output data to the processor 310. The processor 310 initializes the test units which terminate the tests and then instructs and resets the operating conditions of the test units for a digital (or analog) signal test which will be subsequently performed. While the operating conditions of the test units are reset, the processor 310 performs the arithmetic operation and the non-defective/defective determination on the basis of the acquired output data relating to the leakage current test. The test units start the digital (or analog) signal test regardless of the result of the leakage current test, which is a result of the preceding program.

In summary, a second measuring method according to the combinational measuring method directly includes each operation of the first measuring method according to the sequential measuring method. However, a third operation of the second measuring method is different from the third operation of the first measuring method in that the third operation of the second measuring method includes a third-first operation of calculating, by the processor, the test value through the software module from the test data when a calculation through the software module is required so as to obtain the test value and determining, by the processor, whether the DUT is non-defective or defective using the test data as the test value when the calculation through the software module is not required, and, prior to the third-first operation, the third operation of the second measuring method further includes a third-zeroth operation of beginning, by the processor, a repetition of the first operation to the third operation so as to perform another test different from the specific test. That is, it may be a technical feature of the combinational test method in which the processor starts the subsequent test in parallel with the performing of the third-first operation to save an overall test time instead of starting the subsequent test by waiting until the result of the non-defective/defective determination according to the third-first operation is acquired.

The skilled person will understand a recursive description method described in this disclosure and the appended claims, i.e., a description method in which any specific operation includes its own operation with respect to a series of tests which are continuously performed (i.e., the third-zeroth operation includes the third operation) because this is commonly used in a software field (a so-called recursive algorithm). The skilled person will understand well that such a recursive algorithm may be mutually converted into an iterative algorithm. Accordingly, the recursive description method is exactly equal or equivalent to a corresponding repetitive description method.

As compared to the sequential test method, the above-described combinational measurement method has an advantage which is capable of reducing time required for a test. However, in order for such multi-tasking to occur, a processor with multiple cores and a high-speed calculation function is necessary such that there is a probability that manufacturing costs increase.

The pattern generating unit 322, the current-time converting unit 324, and the data operation unit 326, which have been described above, are examples showing that the processor 310 performs through the execution of the software module 320 in place of functions which are performed by the conventional measuring devices, which are connected to the DUT and have calculation functions, or test functions through a process which is calculated in a separate microcontroller. In addition to the above description, the skilled person will conceive that the processor 310 may perform functions of calculating, determining, and storing of data in place of various measuring devices, and thus it should be understood that the present invention includes such various embodiments.

In particular, since a recent processor has quad/octa cores and has a clock in a gigahertz (GHz) unit and a bus interface in a GHz unit, an environment in which the processor may directly perform more and more various test functions is created. Consequently, softwarization of the measuring device according to the present invention is expected to be easier.

Meanwhile, as exemplarily shown in FIG. 3B, the processor-based measuring device according to the present invention may include the separate auxiliary processor 315 in addition to the processor 310. At least some of the operations performed by the processor and the processes included in the operations may be performed by the auxiliary processor 315. Since the measuring device according to the present invention is in charge of various functions of testing, calculating, determining, and analyzing, high performance of the processor 310 is required which results in a burden of a high cost. When the separate auxiliary processor 315 is used in addition to the processor 310, the skilled person will understand that there is room to implement an economical measuring device while securing performance to some extent.

As described above, in accordance with the present invention, occupation of hardware of the measuring device can be reduced in all the above-described embodiments such that there is an effect of reducing costs of miniaturization and manufacturing of the measuring device.

As described above in the embodiments, advantages of the technology described herein can supplement the disadvantages of the related art to reduce costs as well as analyze various signals generated during the test process and store the analyzed results in real time such that the function of the measuring device, which remains in a test in the related art, can extend to a real-time data analysis area.

On the basis of the description of the above embodiments, the skilled person will clearly appreciate that the present invention can be achieved through a combination of the software module and the hardware module. Targets of the technical solution of the present invention or portions contributing to the related art may be implemented in the form of a program command which is executable through various components and may be recorded in a machine-readable recording medium. The machine-readable recording medium may include program commands, data files, data structures, and the like alone or as a combination thereof. The program commands recorded in the machine-readable recording medium may be specially designed and configured for the present invention or may be known and available to the skilled person in the software art. Examples of the machine-readable recording media include magnetic media such as a hard disk, a floppy disk, and a magnetic tape, optical recording media such as a compact disc read only memory (CD-ROM) and a digital versatile disc (DVD), magneto-optical media such as a floptical disk and the like, and hardware devices specifically configured to store and execute program commands, such as a read only memory (ROM), a random access memory (RAM), a flash memory, and the like. Examples of the program instructions include machine language codes generated by a compiler as well as high-level language codes which are executable by a processor using an interpreter or the like.

The measuring device according to the present invention, particularly, the processor of the measuring device, may include one or more software modules as described above for performing the processes according to the present invention or may be configured to perform the one or more software modules.

The measuring device according to the present invention may include a memory such as a ROM, a RAM, or the like for storing program instructions. The processor configured to execute the program instructions stored in the memory may include a central processing unit (CPU) or a graphics processing unit (GPU) and the above-described communication unit which may transmit and receive signals to and from an external device. Further, the measuring device according to the present invention may include a keyboard, a mouse, and other external input devices so as to receive commands written by developers.

While the present invention has been described with reference to specific items such as particular components, exemplary embodiments, and drawings, these are merely provided to aid in understanding the present invention, and the present invention is not limited to these embodiments and those skilled in the art to which the present invention pertains can variously alter and modify from the description of the present invention.

Therefore, the spirit of the present invention should not be limited to the above-described embodiments, and it should be construed that the appended claims as well as all equivalents or equivalent modifications of the appended claims will fall within the scope of the present invention.

Such equivalents or equivalent modifications will include, for example, methods which are mathematically or logically equivalent to the method according to the present invention and are capable of producing the same results as those when the method according to the present invention is practiced.

What is claimed is:

1. A processor-based measuring method of testing a device under test (DUT) having a plurality of terminals, comprising:
   (a) performing, by a processor, (i) a process of acquiring a power setting signal and a switch setting signal and (ii) a process of providing a test pattern table;
   (b) when the test pattern table is provided, transmitting, by the processor, a test start signal to a bus controller such that the bus controller opens a bus; and
   (c) when the bus is opened, performing (i) a process in which the processor performs a test on a DUT by putting the test pattern table, the power setting signal, and the switch setting signal on the bus together with a test order number to be respectively transmitted to a tester channel, a switch controller, and a power supply such that the tester channel applies a pattern signal according to the test pattern table to the DUT, the power supply applies a power supply voltage according to the power setting signal to the DUI, and the switch controller controls the switch interposed between the tester channel and the DUT according to the switch setting signal; and
   (d) when the test is completed, performing (i) a process of initializing, by the processor, the power setting signal and the switch setting signal; and (ii) a process of transmitting a test end signal to the bus controller such that the bus controller blocks the bus.

2. The processor-based measuring method of claim 1, wherein, in operation (b), a communication port of a communication unit connected to the bus is opened by the communication unit which receives the test start signal,
in operation (c), test data acquired from the DUT by the test is transmitted to the communication unit through the bus, and
in performing the test, operation (c) satisfies at least one condition of (1) a condition in which at least some of the signals, which are put on the bus and transmitted, are written in a memory or a predetermined storage device in real time, and (2) a condition in which at least some of the signals are preserved by an external device through the communication unit.

3. The processor-based measuring method of claim 1, wherein, in operation (c), when an analog test is performed on the DUT and then test data acquired from the DUT is transmitted to the processor through the bus controller as a result of the analog test, the processor calculates a characteristic value of an analog signal from the test data through a software module executed by the processor.

4. The processor-based measuring method of claim 3, wherein the characteristic value of the analog signal includes at least one among accuracy, resolution, a dynamic range, an offset error, a gain error, differential nonlinearity, and integral nonlinearity.

5. The processor-based measuring method of claim 1, wherein:
in operation (c), the test includes a leakage current test; and
when time spent in leakage of a leakage current is measured, the processor performs the leakage current test by performing a process of converting the time spent in the leakage into the leakage current through a software module executed by the processor.

6. The processor-based measuring method of claim 5, wherein, when time spent in variation of a voltage relative to a predetermined voltage variance is measured with respect to a test terminal connected to the DUT, and then time data which is a measured result of the spent time is transmitted to the processor through the bus controller, the processor performs the leakage current test through a calculation by setting a predetermined capacitance value of the test terminal and the voltage variance as constant values.

7. A processor-based measuring method of testing a device under test (DUT) having a plurality of terminals, comprising:
(a) performing, by a processor, (i) a process of acquiring a power setting signal and a switch setting signal and (ii) a process of providing a test pattern table for a specific test;
(b) when the test pattern table is provided, performing, by the processor, (i) a process of the specific test on the DUT in a manner in which the test pattern table, the power setting signal, and the switch setting signal are put on a bus together with the test order number to be respectively transmitted to the tester channel, the switch controller, and the power supply such that the tester channel applies a pattern signal according to the test pattern table to the DUT, the power supply applies a power supply voltage according to the power setting signal to the DUT, and the switch controller controls the switch interposed between the tester channel and the DUT according to the switch setting signal; and (c) when test data is acquired from the DUT by the test, determining, by the processor, whether the DUT is non-defective or defective by comparing a test value, (i) which is the test data or (ii) which is calculated from the test data through a software module executed by the processor, with an expected value according to the specific test,
wherein operation (c) includes (c1), when a calculation through the software module is required so as to acquire the test value, calculating, by the processor, the test value through the software module from the test data and, when the calculation through the software module is not required, determining, by the processor, whether the DUT is non-defective or defective using the test data as the test value; and
prior to operation (c1), operation (c) further includes (c0) starting, by the processor, repetition of operations (a) to (c) for another test different from the specific test.

8. A processor-based measuring device for testing a device under test (DUT) having a plurality of terminals, comprising:
a processor configured to perform a process of acquiring a power setting signal and a switch setting signal and a process of providing a test pattern table and configured to generate a test start signal when the test pattern table is provided;
a bus connected to the processor;
a bus controller configured to open the bus when receiving the test start signal from the processor;
at least one tester channel configured to apply a pattern signal according to the acquired test pattern table, which is put on the bus, to a DUT;
a switch interposed between the at least one tester channel and the DUT;
a power supply configured to apply a power supply voltage according to the acquired power setting signal, which is put on the bus, to the DUT; and
a switch controller configured to control the switch according to the acquired switch setting signal which is on the bus,
wherein, when the bus is opened, the processor performs a test on the DUT by putting the test pattern table, the power setting signal, and the switch setting signal on the bus together with a test order number to be respectively transmitted to the at least one tester channel, the switch controller, and the power supply,
wherein, when the test is completed, the processor performs (i) a process of initializing the power setting signal and the switch setting signal and (ii) a process of transmitting a test end signal to the bus controller such that the bus controller blocks the bus.

9. The processor-based measuring device of claim 8, further comprising a communication unit connected to the bus,
wherein the communication unit is configured to open a communication port of the communication unit when receiving the test start signal from the processor,
test data acquired from the DUT by the test is transmitted to the communication unit through the bus, and
wherein, in performing the test, at least one of (1) a condition in which at least some of the signals, which are put on the bus and transmitted, are written in a memory included in the measuring device or a predetermined storage device in real time, and (2) a condition in which at least some of the signals are preserved by an external device through the communication unit is satisfied.

10. The processor-based measuring device of claim 8, wherein, when an analog test is performed on the DUT and then test data acquired from the DUT is transmitted to the processor through the bus controller as a result of the analog test, the processor calculates a characteristic value of an analog signal from the test data through a software module executed by the processor.

11. The processor-based measuring device of claim 8, wherein:
   the test being performed includes a leakage current test; and
   when time spent in leakage of a leakage current is measured, the processor performs the leakage current test by performing a process of converting the time spent in the leakage into the leakage current through a software module executed by the processor.

12. The processor-based measuring device of claim 11, wherein, when time spent in variation of a voltage relative to a predetermined voltage variance is measured with respect to a test terminal connected to the DUT and then time data which is a measured result of the spent time is transmitted to the processor through the bus controller, the processor performs the leakage current test through a calculation by setting a predetermined capacitance value of the test terminal and the voltage variance as constant values.

13. The processor-based measuring device of claim 8, further comprising an auxiliary processor different from the processor,
   wherein the auxiliary processor performs at least some of the functions, which are to be performed by the processor, in place of the processor.

* * * * *